United States Patent
Chen et al.

(10) Patent No.: US 11,823,738 B2
(45) Date of Patent: Nov. 21, 2023

(54) RESISTIVE MEMORY APPARATUS

(71) Applicant: Winbond Electronics Corp., Taichung (TW)

(72) Inventors: Frederick Chen, San Jose, CA (US); Hsiu-Han Liao, Taichung (TW); Po-Yen Hsu, Taichung (TW); Chi-Shun Lin, Fremont, CA (US)

(73) Assignee: Winbond Electronics Corp., Taichung (TW)

( * ) Notice: Subject to any disclaimer, the term of this patent is extended or adjusted under 35 U.S.C. 154(b) by 152 days.

(21) Appl. No.: 17/541,168

(22) Filed: Dec. 2, 2021

(65) Prior Publication Data
US 2023/0178149 A1 Jun. 8, 2023

(51) Int. Cl.
  *G11C 11/00* (2006.01)
  *G11C 13/00* (2006.01)
  *G11C 5/06* (2006.01)

(52) U.S. Cl.
  CPC ............ *G11C 13/004* (2013.01); *G11C 5/063* (2013.01); *G11C 13/0026* (2013.01); *G11C 13/0028* (2013.01); *G11C 13/0038* (2013.01); *G11C 13/0064* (2013.01); *G11C 13/0069* (2013.01)

(58) Field of Classification Search
  CPC . G11C 13/004; G11C 13/063; G11C 13/0026; G11C 13/0028
  USPC .......................................................... 365/148
  See application file for complete search history.

(56) References Cited

U.S. PATENT DOCUMENTS

| | | | |
|---|---|---|---|
| 6,104,653 A * | 8/2000 | Proebsting | G11C 8/08 257/E21.659 |
| 6,847,544 B1 | 1/2005 | Smith et al. | |
| 8,009,456 B2 | 8/2011 | Shimomura et al. | |
| 8,355,274 B2 | 1/2013 | Arita et al. | |
| 8,422,268 B2 | 4/2013 | Arita et al. | |
| 8,759,190 B2 | 6/2014 | Miyanaga et al. | |
| 8,766,226 B2 | 7/2014 | Nojiri | |
| 2013/0080847 A1 | 3/2013 | Zorian et al. | |
| 2017/0053688 A1* | 2/2017 | Seo | G11C 11/1655 |
| 2018/0062659 A1* | 3/2018 | Oda | H03K 19/1776 |

(Continued)

FOREIGN PATENT DOCUMENTS

CN 107112049 8/2017

OTHER PUBLICATIONS

"Office Action of Taiwan Counterpart Application", dated Jan. 11, 2023, p. 1-p. 7.

*Primary Examiner* — Vu A Le
(74) *Attorney, Agent, or Firm* — JCIPRNET

(57) ABSTRACT

A resistive memory apparatus including bit lines, word lines, a memory array, bypass paths, select circuits, and a switch circuit is provided. The word lines are respectively crossed with the bit lines. The memory array includes memory elements. One end of each of the memory elements is coupled to the corresponding word line, and another end of each of the memory elements is coupled between a first node and a second node on the corresponding bit line. Each of the bypass paths is connected in parallel with the corresponding bit line between the first node point and the second node. Each of the select circuits is coupled to the corresponding bit line and bypass path, and configured to select the coupled bit line or bypass path. The switch circuit is coupled to the word lines, and configured to select one of the word lines.

14 Claims, 6 Drawing Sheets

(56) References Cited

U.S. PATENT DOCUMENTS

2018/0358093 A1    12/2018   Lesartre et al.
2021/0020235 A1     1/2021   Chou et al.

* cited by examiner

RESISTIVE MEMORY APPARATUS

BACKGROUND OF THE INVENTION

Field of the Invention

The invention relates to a memory apparatus, and more particularly to a resistive memory apparatus.

Description of Related Art

Resistive random-access memory (RRAM) is a non-volatile memory that is actively developed in the industry. In the architecture of 1-transistor-1-resistor (1T1R), the current through the resistive memory cell is controlled by a transistor. In this type of architecture, the area of the transistor used to control the current is larger. If an attempt is made to shrink the transistor, the manufacturing process becomes more complicated and the current supplied is also reduced. Therefore, the 1-selector-1-resistor (1S1R) architecture replacing the transistor with a selector is gradually used in the industry.

However, in the current architecture of 1S1R, even a memory element that is not selected generates a sneak current, thus not only readily causing errors in the read operation, but also sometimes causing improper transition of neighboring memory elements. For example, FIG. 1A and FIG. 1B show schematic diagrams of a sneak current on a conventional resistive memory apparatus. Referring to FIG. 1A and FIG. 1B, in FIG. 1A, since a memory element MT is selected for operation, a switch element SW is turned on to write data into the memory element MT or read data from the memory element MT. However, as shown in FIG. 1A, a memory element MN1 that is not selected may also generate a sneak current SC1 along a path P1, thereby affecting the operation. Similarly, as shown in FIG. 1B, memory elements MN2 and MN3 that are not selected may also generate a sneak current SC2 along a path P2, thereby affecting the operation. The more cells that are connected in the manner of FIGS. 1A and 1B, the greater the influence caused by the sneak current. Therefore, how to manage the sneak current is a major issue for designers in the art.

SUMMARY OF THE INVENTION

The invention provides a resistive memory apparatus that may manage sneak current and reduce the influence caused by the sneak current.

A resistive memory apparatus of the invention includes a plurality of bit lines, a plurality of word lines, a memory array, a plurality of bypass paths, a plurality of select circuits, and a switch circuit. The plurality of word lines are respectively crossed with the plurality of bit lines. The memory array includes a plurality of memory elements. One end of each of the memory elements is coupled to the corresponding word line, and another end of each of the memory elements is coupled between a first node and a second node on the corresponding bit line. Each of the bypass paths is connected in parallel with the corresponding bit line between the first node and the second node. Each of the select circuits is coupled to the corresponding bit line and bypass path, and configured to select the coupled bit line or bypass path. The switch circuit is coupled to the plurality of word lines, and configured to select one of the plurality of word lines.

In an embodiment of the invention, when one of the plurality of memory elements is selected as a select memory element, the select circuit coupled to the select memory element via the bit line selects the coupled bit line, and other select circuits select the coupled bypass path.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
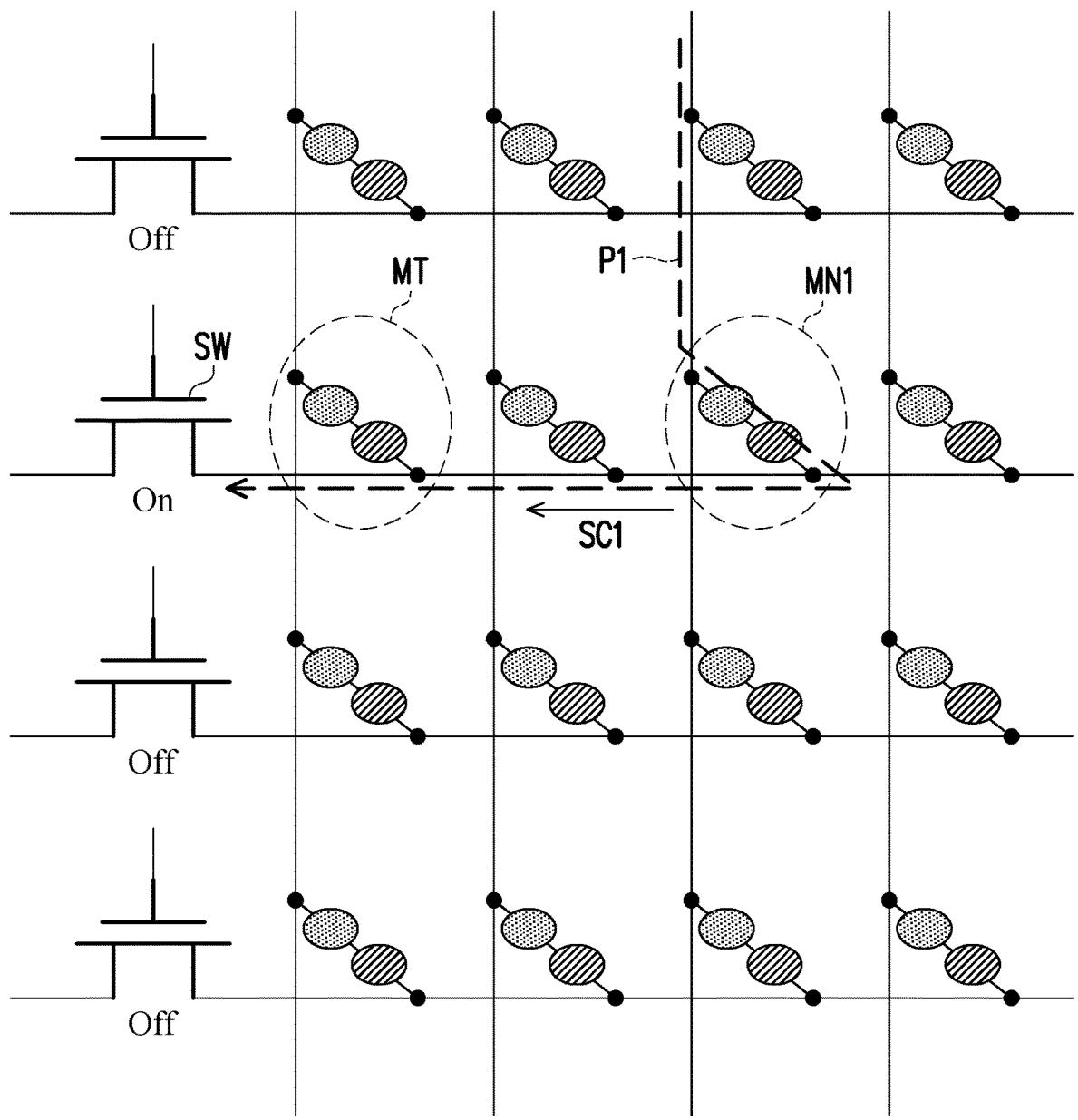
FIG. 1A and FIG. 1B show schematic diagrams of a sneak current on a conventional resistive memory apparatus.
Figure 1B:
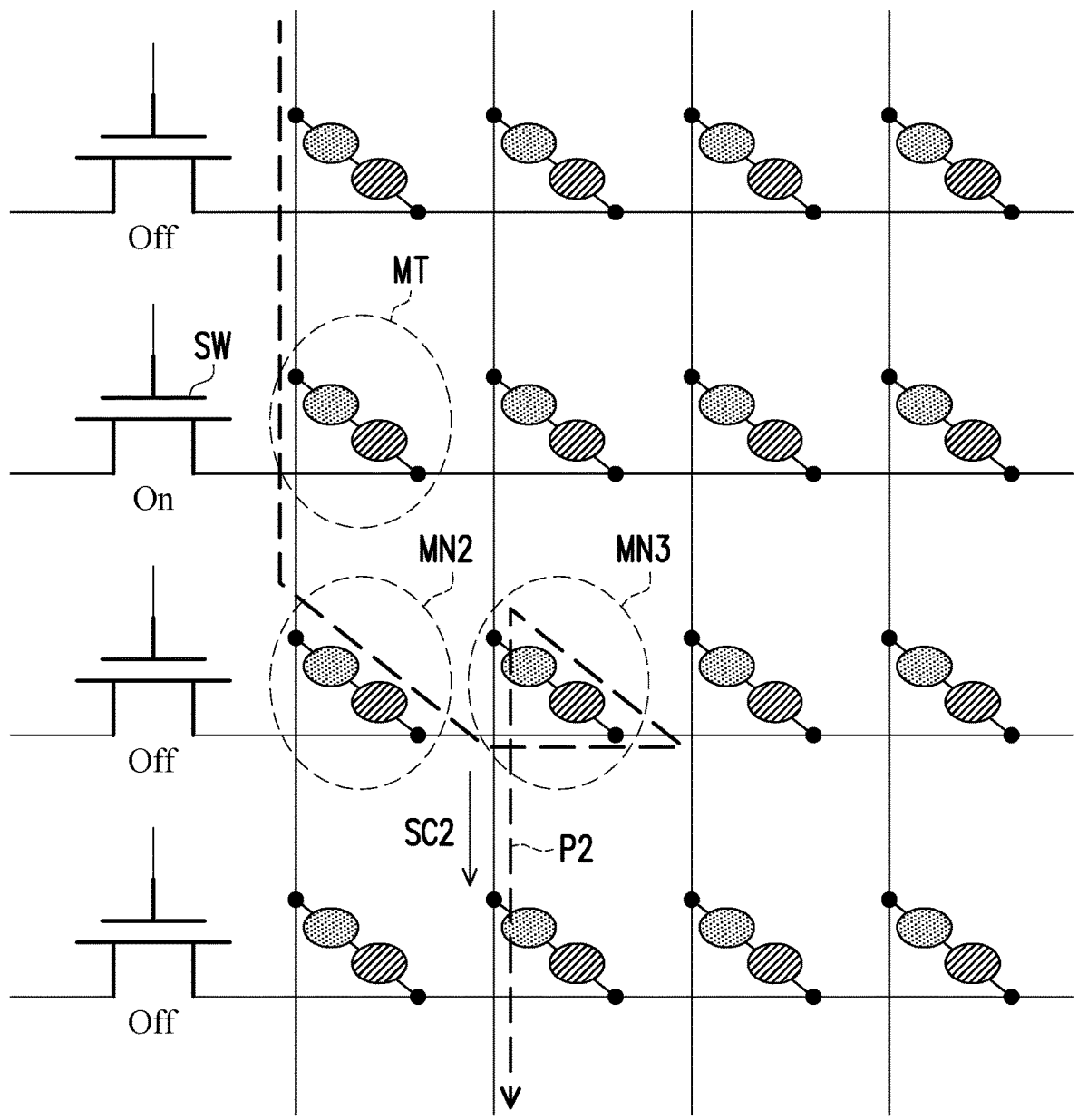
Figure 2:
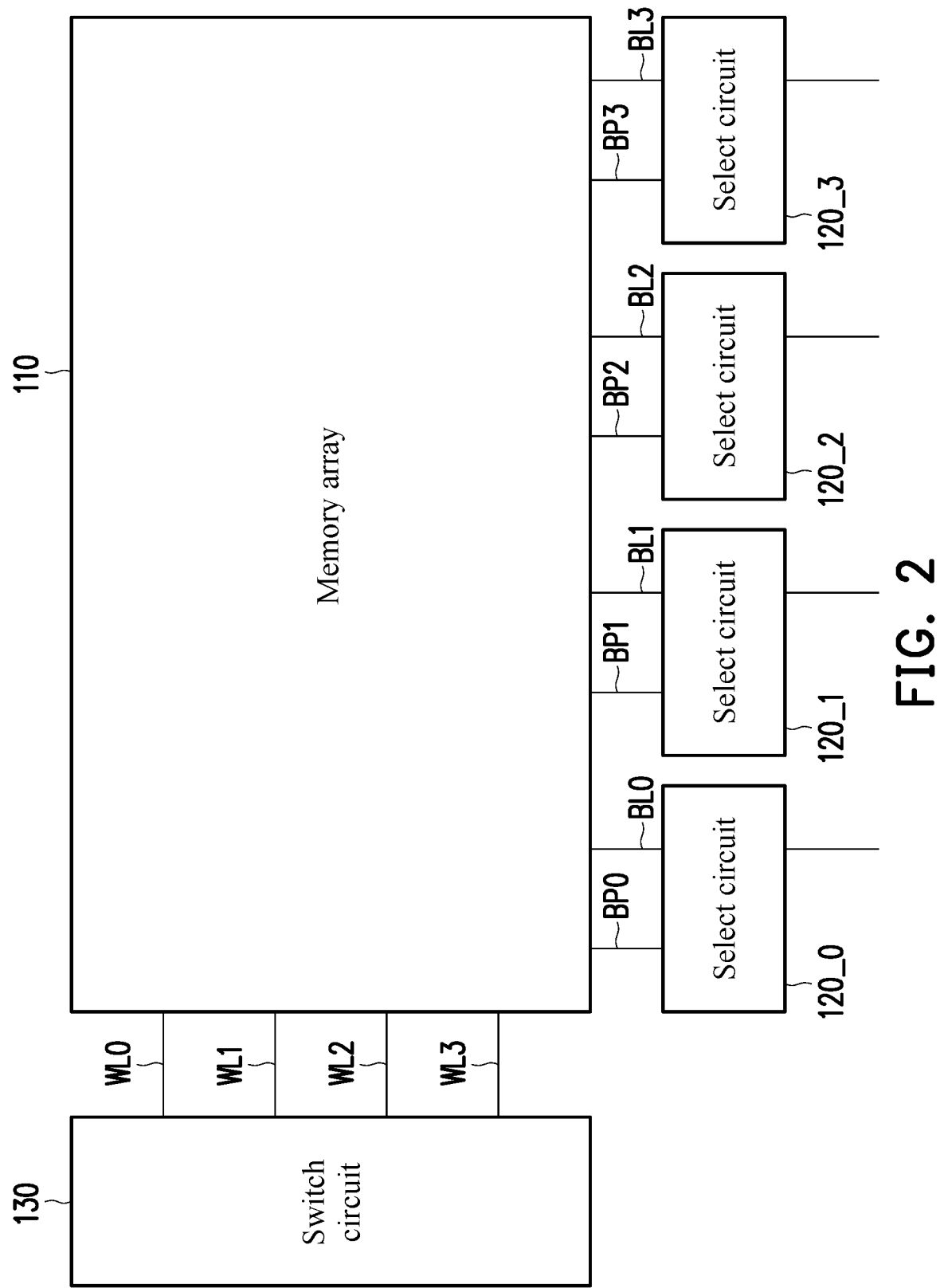
FIG. 2 is a schematic block diagram of a resistive memory apparatus according to an embodiment of the invention.
Figure 3:
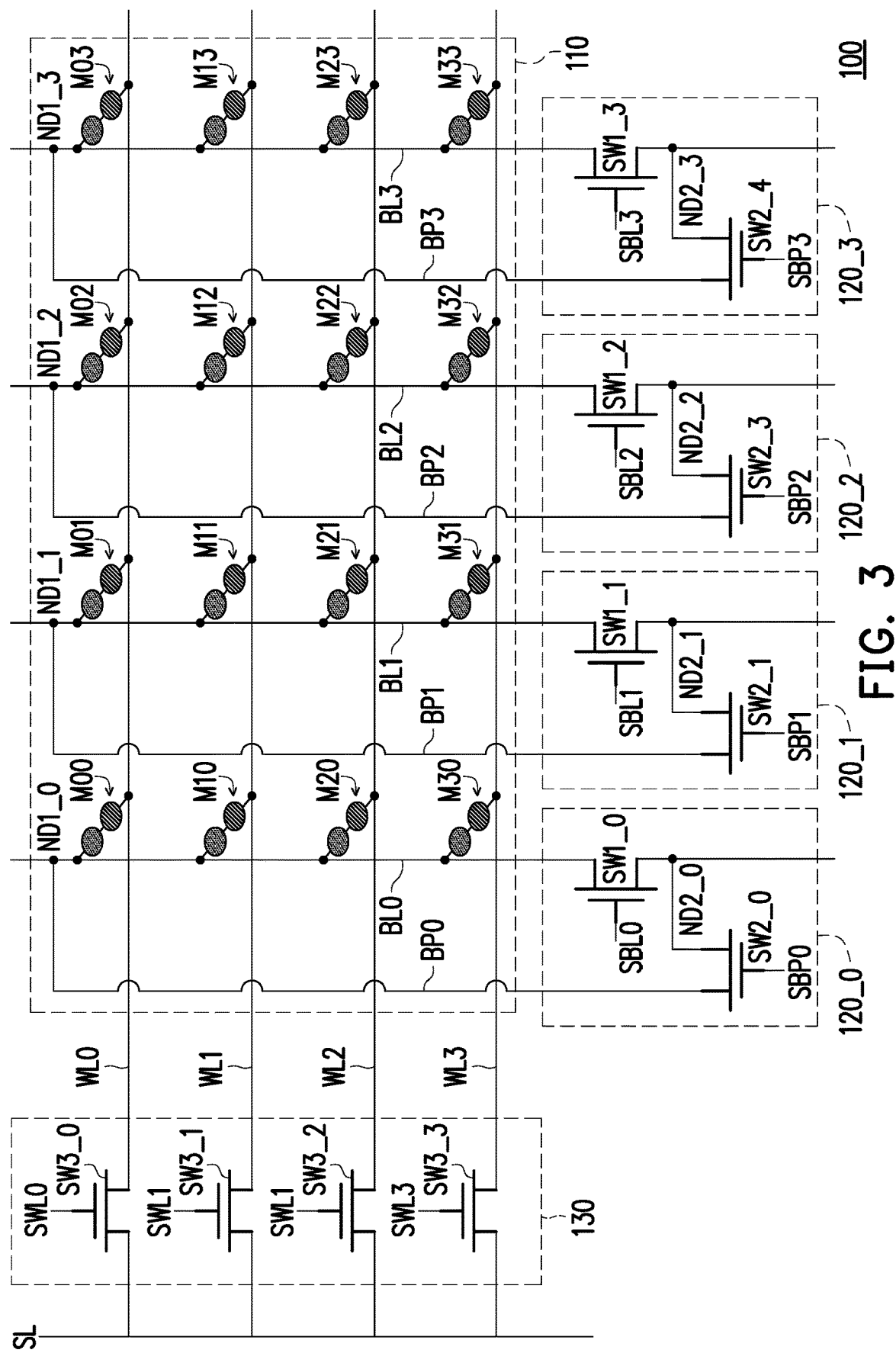
FIG. 3 is a schematic circuit diagram of a resistive memory apparatus according to an embodiment of the invention.

FIG. 2 is a schematic block diagram of a resistive memory apparatus according to an embodiment of the invention. FIG. 3 is a schematic circuit diagram of a resistive memory apparatus according to an embodiment of the invention. Please refer to FIG. 2 and FIG. 3 at the same time. The resistive memory apparatus 100 includes bit lines BL0 to BL3, word lines WL0 to WL3, bypass paths BP0 to BP3, a memory array 110, select circuits 120_0 to 120_3, and a switch circuit 130. As shown in FIG. 3, the word lines WL0 to WL3 are disposed in a crossed manner with the bit lines BL0 to BL3, respectively, and the crossing angle is, for example, about degrees, but the invention is not limited thereto. The resistive memory apparatus is a subset of a larger memory array.

The memory array 110 includes memory elements M00 to M33. As shown in FIG. 3, one end of the memory elements M00 to M03 is coupled to the word line WL0, one end of the memory elements M10 to M13 is coupled to the word line WL1, one end of the memory elements M20 to M23 is coupled to the word line WL2, and one end of the memory elements M30 to M33 is coupled to the word line WL3. Another end of the memory elements M00, M10, M20, and M30 is coupled between a first node ND1_0 and a second node ND2_0 on the bit line BL0. Another end of the memory elements M01, M11, M21, and M31 is coupled between a first node ND1_1 and a second node ND2_1 on the bit line BL1. Another end of the memory elements M02, M12, M22, and M32 is coupled between a first node ND1_2 and a second node ND2_2 on the bit line BL2. Another end of the memory elements M03, M13, M23, and M33 is coupled between a first node ND1_3 and a second node ND2_3 on the bit line BL3.

Figure 4:
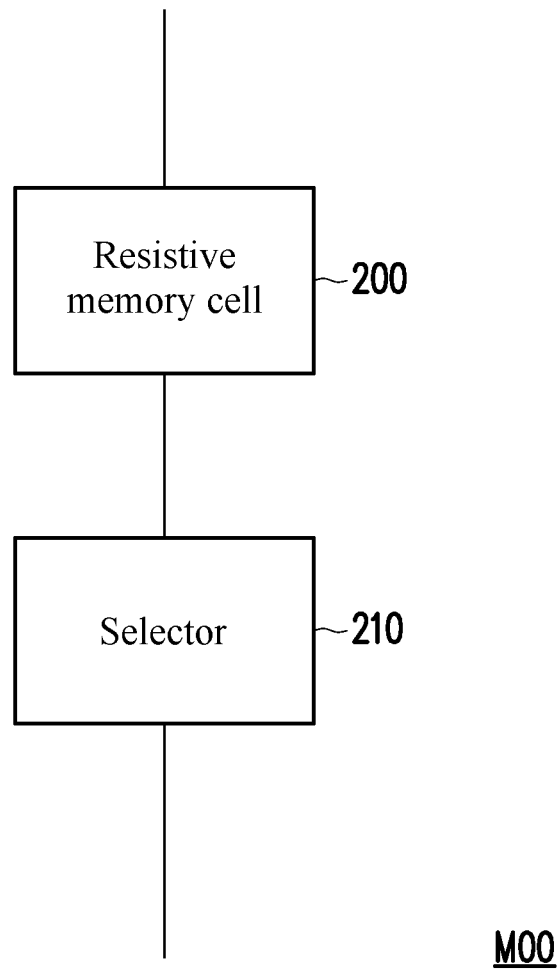
FIG. 4 is a schematic block diagram of a memory apparatus according to an embodiment of the invention.

The following uses the memory element M00 as an example to describe the internal structure of the memory element of the present embodiment. The internal structures of the other memory elements M01 to M33 are the same as that of the memory element M00. FIG. 4 is a schematic block diagram of a memory apparatus according to an embodiment of the invention. Please refer to FIG. 4. The memory element M00 includes a resistive memory cell 200 and a selector 210. The resistive memory cell 200 may provide a single bit of stored data. The selector 210 may be an ovonic threshold switch (OTS) that is a two-terminal symmetrical voltage-sensitive switching element. For example, when an applied voltage smaller than a threshold voltage is applied to the selector 210, the selector 210 is maintained in an off state (for example, a non-conductive state). Moreover, when an applied voltage greater than the threshold voltage is applied in any direction of the selector 210, the selector 210 becomes turned on (for example, a conductive state). In other words, the selector 210 may allow two-way switching, and because there is no need to control whether the node is turned on (for example, the gate of a metal-oxide-semiconductor field-effect transistor (MOSFET) or the base of a bipolar junction transistor (BJT)), the advantage of small area is achieved. Furthermore, the selector 210 may be based on field-enhanced emission or tunneling.

It should be mentioned that, in the invention, it is not necessary to limit the arrangement sequence of the resistive memory cell 200 and the selector 210 in the memory element M00, as long as the configuration of one resistive memory cell 200 and one selector 210 in one memory element M00 is met. In an embodiment, the selector 210 also may be integrated into the resistive memory cell 200.

Returning to FIG. 2 and FIG. 3, the bypass paths BP0 to BP3 are connected in parallel with the bit lines BL0 to BL3, respectively. As shown in FIG. 3, the bypass path BP0 is connected in parallel with the bit line BL0 between the first node ND1_0 and the second node ND2_0. The bypass path BP1 is connected in parallel with the bit line BL1 between the first node ND1_1 and the second node ND2_1. The bypass path BP2 is connected in parallel with the bit line BL2 between the first node ND1_2 and the second node ND2_2. The bypass path BP3 is connected in parallel with the bit line BL3 between the first node ND1_3 and the second node ND2_3.

The select circuits 120_0 to 120_3 are respectively coupled to the bit lines BL0 to BL3 and the bypass paths BP0 to BP3. The select circuit 120_0 is coupled to the bit line BL0 and the bypass path BP0, and is configured to select the coupled bit line BL0 or bypass path BP0 to conduct voltage or current. The select circuit 120_1 is coupled to the bit line BL1 and the bypass path BP1, and is configured to select the coupled bit line BL1 or bypass path BP1 to conduct voltage or current. The select circuit 120_2 is coupled to the bit line BL2 and the bypass path BP2, and is configured to select the coupled bit line BL2 or bypass path BP2 to conduct voltage or current. The select circuit 120_3 is coupled to the bit line BL3 and the bypass path BP3, and is configured to select the coupled bit line BL3 or bypass path BP3 to conduct voltage or current.

The switch circuit 130 is coupled to the word lines WL0 to WL3. The switch circuit 130 is configured to select one of the word lines WL0 to WL3 to conduct voltage or current.

In the present embodiment, the select circuits 120_0 to 120_3 and the switch circuit 130 may all achieve selection operation by operating the switch element. The switch element may be formed by a transistor, for example. As shown in FIG. 3, the select circuit 120_0 includes a first switch element SW1_0 and a second switch element SW2_0, the select circuit 120_1 includes a first switch element SW1_1 and a second switch element SW2_1, the select circuit 120_2 includes a first switch element SW1_2 and a second switch element SW2_2, and the select circuit 120_3 includes a first switch element SW1_3 and a second switch element SW2_3. The switch circuit 130 includes third switch elements SW3_0 to SW3_3.

The first switch elements SW1_0 to SW1_3 may be turned on or off under the control of control signals SBL0 to SBL3, respectively. The second switch elements SW2_0 to SW2_3 may be turned on or off under the control of control signals SBP0 to SBP3, respectively. The third switch elements SW3_0 to SW3_3 may be turned on or off under the control of control signals SWL0 to SWL3, respectively. The control signals SBL0 to SBL3, SBP0 to SBP3, and SWL0 to SWL3 may come from a memory controller external to the resistive memory apparatus 100, for example.

The internal circuits of the select circuits 120_0 to 120_3 are configured in a similar manner. Taking the select circuit 120_0 as an example, the first switch element SW1_0 is configured on the bit line BL0, the second switch element SW2_0 is disposed on the bypass path BP0, and one end of the first switch element SW1_0 and one end of the second switch element SW2_0 are commonly coupled to ND2_0 on the bit line BL0.

In the switch circuit 130, one end of the third switch elements SW3_0 to SW3_3 is respectively coupled to the word lines WL0 to WL3, and another end of the third switch elements SW3_0 to SW3_3 is coupled to a source line SL.

In the present embodiment, when one of the memory elements M00 to M33 is selected as the select memory element MS, the select circuit coupled to the select memory element MS via the bit line selects the coupled bit line to conduct voltage or current, and other select circuits select the coupled bypass path to conduct voltage or current. The select memory element MS is selected, for example, to perform a write operation or a read operation. The following takes the case where the memory element M10 is selected as an example to illustrate the operation mode when the memory element M10 is used as the select memory element MS.

Figure 5A:
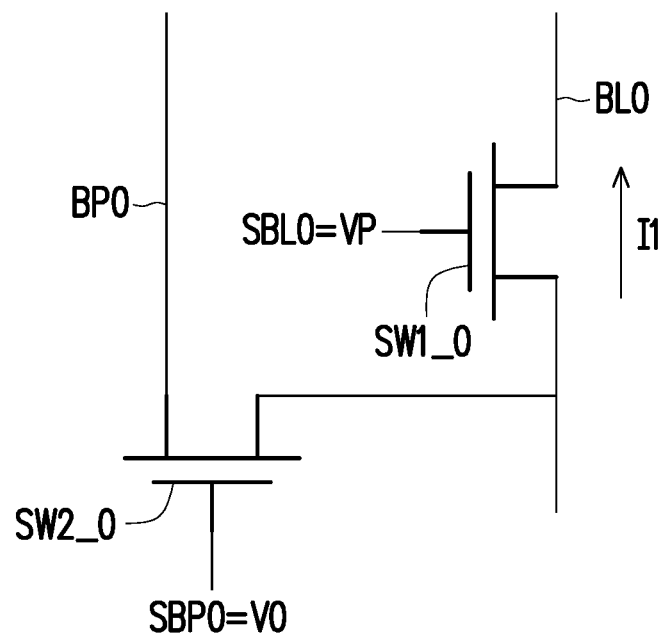
FIG. 5A and FIG. 5B are examples of the operation method of a select circuit according to an embodiment of the invention.
Figure 5B:
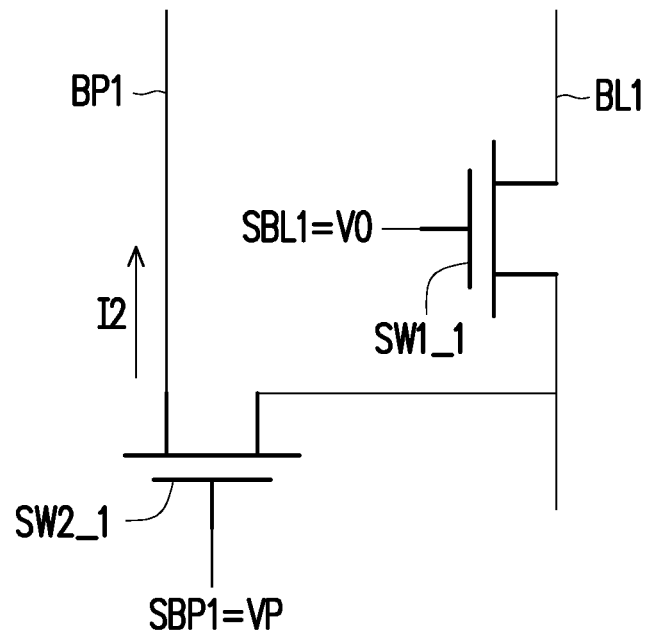

Specifically, FIG. 5A and FIG. 5B are examples of the operation method of a select circuit according to an embodiment of the invention. When the select memory element MS (the memory element M10) is selected, the select circuit 120_0 selects the bit line BL0 to conduct voltage or current. As shown in FIG. 5A, the first switch element SW1_0 disposed on the bit line BL0 corresponding to the select memory element MS is turned on based on the control signal SBL0 of a turn-on level VP to generate a current I1. The second switch element SW2_0 disposed on the bypass path BP0 connected in parallel with the bit line BL0 is turned off based on the control signal SBP0 of a turn-off level VO.

Moreover, when the select memory element MS (the memory element M10) is selected, the select circuits 120_1 to 120_3 respectively select the bypass paths BP1 to BP3 to conduct voltage or current. The first switch elements SW1_1 to SW1_3 disposed on the bit lines BL1 to BL3 corresponding to other memory elements are turned off, and the second switching elements SW2_1 to SW2_3 disposed on the bypass paths BP1 to BP3 connected in parallel with the bit lines BL1 to BL3 corresponding to the other memory elements are turned on. Taking the select circuit 120_1 as an example, as shown in FIG. 5B, the first switch element SW1_1 disposed on the bit line BL1 is turned off based on the control signal SBL1 of the turn-off level VO, and the second switch element SW2_1 disposed on the bypass path BP1 connected in parallel with the bit line BL1 is turned on based on the control signal SBP1 of the turn-on level VP to generate a current I2.

Moreover, when the select memory element MS (the memory element M10) is selected, the third switch element SW3_1 coupled to the word line WL1 corresponding to the select memory element MS is also turned on based on the control signal SWL1 of the turn-on level VP.

Via the above method, when the memory element MS is selected for a write operation or a read operation, only the bit line coupled to the select memory element MS remains turned on, and the conduction paths of other bit lines are all replaced by bypass paths. In this way, the number of paths that could generate sneak current is reduced by being limited to a sufficiently small subset of the memory array, thereby reducing the influence caused by sneak current.

It should be mentioned that, in an embodiment of the invention, a 4×4 memory array 110 including 16 memory elements M00 to M33 is used for description. However, the invention is not limited thereto, and those skilled in the art may infer the number of used memory elements to be more based on actual needs according to the teachings of the invention. Moreover, those skilled in the art may also suitably arrange a plurality of resistive memory apparatuses taught in the invention, for example, in the extending direction of the bit lines to expand into a larger memory array.

Based on the above, in the resistive memory apparatus of the invention, a plurality of bypass paths are provided. When one of the plurality of memory elements is selected, in addition to the bit lines needed to operate the selected memory element, the conduction paths of the other bit lines may be replaced by bypass paths. In this way, the resistive memory apparatus of the invention may reduce the path that generates sneak current, and even in a structure with a larger area, influence caused by the sneak current may also be truly reduced.

What is claimed is:

1. A resistive memory apparatus, comprising:
    a plurality of bit lines;
    a plurality of word lines respectively disposed in a crossed manner with the bit lines;
    a memory array comprising a plurality of memory elements, wherein one end of each of the memory elements is coupled to the corresponding word line, and another end of each of the memory elements is coupled between a first node and a second node on the corresponding bit line;
    a plurality of bypass paths, wherein each of the bypass paths is connected in parallel with the corresponding bit line between the first node and the second node;
    a plurality of select circuits, wherein each of the select circuits is coupled to the corresponding bit line and bypass path, and configured to select the coupled bit line or bypass path; and
    a switch circuit coupled to the word lines and configured to select one of the word lines.

2. The resistive memory apparatus of claim 1, wherein when one of the memory elements is selected as a select memory element, the select circuit coupled to the select memory element via the bit line selects the coupled bit line, and other select circuits select the coupled bypass paths.

3. The resistive memory apparatus of claim 2, wherein each of the select circuits comprises a first switch element and a second switch element, the first switch element is disposed on the corresponding bit line, the second switch element is disposed on the corresponding bypass path, and one end of the first switch element and one end of the second switch element are commonly coupled to the second node on the corresponding bit line.

4. The resistive memory apparatus of claim 3, wherein when the select memory element is selected, the first switch element disposed on the bit line corresponding to the select memory element is turned on, and the second switch element disposed on the bypass path connected in parallel to the bit line corresponding to the select memory element is turned off.

5. The resistive memory apparatus of claim 3, wherein when the select memory element is selected, the first switch element disposed on the bit lines corresponding to other memory elements is turned off, and the second switch element disposed on the bypass paths connected in parallel to the bit lines corresponding to the other memory elements is turned on.

6. The resistive memory apparatus of claim 2, wherein the switch circuit comprises a plurality of third switch elements, one end of the third switch elements is respectively coupled to the word lines, and another end of the third switch elements is coupled to a source line.

7. The resistive memory apparatus of claim 6, wherein when the select memory element is selected, the third switch element coupled to the word line corresponding to the select memory element is turned on.

8. The resistive memory apparatus of claim 1, wherein each of the memory elements comprises a resistive memory cell and a selector.

9. The resistive memory apparatus of claim 8, wherein the selector is an ovonic threshold switch (OTS) that is a two-terminal symmetrical voltage-sensitive switching element.

10. The resistive memory apparatus of claim 8, wherein the selector is based on field-enhanced emission.

11. The resistive memory apparatus of claim 8, wherein the selector is based on tunneling.

12. The resistive memory apparatus of claim 8, wherein the selector is integrated into the resistive memory cell.

13. The resistive memory apparatus of claim 8, wherein when an applied voltage smaller than a threshold voltage is applied to the selector, the selector is maintained in an off state,
    when an applied voltage greater than the threshold voltage is applied in any direction of the selector, the selector becomes turned on.

14. The resistive memory apparatus of claim 8, wherein the selector allows two-way switching.

* * * * *